United States Patent
Chan et al.

(10) Patent No.: US 6,224,396 B1
(45) Date of Patent: May 1, 2001

(54) COMPLIANT, SURFACE-MOUNTABLE INTERPOSER

(75) Inventors: Benson Chan, Vestal, NY (US); Kishor V. Desai, Fremont, CA (US); John H. Sherman, Lisle, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/329,537

(22) Filed: Jun. 10, 1999

Related U.S. Application Data (63) Continuation-in-part of application No. 08/899,413, filed on Jul. 23, 1997, now abandoned.

(51) Int. Cl.⁷ .................................................. H01R 12/00
(52) U.S. Cl. ................................................. 439/71; 439/66
(58) Field of Search .................................. 439/66, 70, 71

(56) References Cited

U.S. PATENT DOCUMENTS

| | | | |
|---|---|---|---|
| 4,161,346 | 7/1979 | Cherian et al. | 439/66 |
| 4,295,700 | 10/1981 | Sado | 439/66 |
| 4,511,196 | 4/1985 | Schuler et al. | 439/66 |
| 4,514,023 | 4/1985 | Rice | 439/66 |
| 4,553,192 | 11/1985 | Babuka et al. | 439/66 |
| 4,793,814 | 12/1988 | Zifcak et al. | 439/66 |
| 4,827,611 | * 5/1989 | Pai et al. | 29/843 |
| 5,019,944 | 5/1991 | Ishii et al. | 361/400 |
| 5,139,427 | 8/1992 | Boyd et al. | 439/66 |
| 5,199,889 | 4/1993 | McDevitt, Jr. | 439/66 |
| 5,210,939 | 5/1993 | Mallik et al. | 29/840 |
| 5,230,632 | 7/1993 | Baumberger et al. | 439/66 |
| 5,248,262 | 9/1993 | Busacco et al. | 439/66 |
| 5,297,967 | 3/1994 | Baumberger et al. | 439/66 |
| 5,298,685 | 3/1994 | Bindra et al. | 174/250 |
| 5,435,057 | 7/1995 | Bindra et al. | 29/830 |
| 5,509,200 | 4/1996 | Frankeny et al. | 29/852 |
| 5,528,159 | 6/1996 | Charlton et al. | 324/758 |
| 5,600,259 | 2/1997 | Baretyzel et al. | 324/761 |
| 5,608,966 | 3/1997 | Donner et al. | 439/66 |

* cited by examiner

Primary Examiner—T. C. Patel
(74) Attorney, Agent, or Firm—Ratner & Prestia; Lawrence R. Fraley, Esq.

(57) ABSTRACT

An interposer for connecting two circuit members. The interposer has two extending conductive ends, is "Z" shaped, and has a center of gravity positioned relative to one of the conductive ends such that the interposer is capable of standing upright upon that end without external support. The interposer may be composed of a plated metal, and at least one of the extending conductive ends may have deposited dendrites or a raised bump. The Z-shaped interposer prevents bowing or cracking of the connected structure which otherwise occurs during use due to the different thermal coefficients of expansion of the two circuit members.

29 Claims, 8 Drawing Sheets

COMPLIANT, SURFACE-MOUNTABLE INTERPOSER

CROSS-REFERENCE TO RELATED APPLICATIONS

This application is a continuation-in-part of U.S. patent application Ser. No. 08/899,413, filed Jul. 23, 1997 abandoned.

FIELD OF THE INVENTION

The present invention relates in general to electrical connectors for adhering a semiconductor chip to a supporting substrate. In particular, the present invention describes a dendrite-plated interposer structure and method for interconnecting at least two electrical circuit members such as ball grid array (BGA) modules, flip chips, printed circuit boards, chip carriers, circuit modules, or the like.

BACKGROUND OF THE INVENTION

The current trend in connector design for connectors used in the computer field is to provide both high-density and high-reliability connections between various circuit devices that form important parts of the computer. High reliability for such connections is essential due to potential end product failure, should vital misconnections of these devices occur. Typically, integrated circuit chips are attached to a chip carrier, thermally conductive module chip carrier, circuit card, or board by solder bonding, brazing, controlled collapse chip connect, wire lead bonding, metal bump bonding, tape automated bonding, or the like.

One prior technique for providing various interconnections is referred to as a wire bond technique, which involves the mechanical and thermal compression of a soft metal wire (e.g., gold) between one circuit and another. Such bonding does not lend itself readily however, to high-density connections because of possible wire breakage and accompanying mechanical difficulty in wire handling.

Another technique involves strategic placement of solder balls or the like between respective circuit elements (e.g., pads) and reflowing the solder to effect interconnection. Although it has proven extremely successful in providing high-density interconnections for various structures, this technique does not prevent or decrease destructive forces from propagating in the Z-direction.

In yet another technique, an elastomer has been used which includes a plurality of conductive paths (e.g., small diameter wires or columns of conductive material) to provide the necessary interconnections. Known techniques using such material typically possess the following deficiencies: (1) high force necessary per contact which can be inherent in a particular design and exacerbated due to non-planarity of the mating surfaces; (2) relatively high electrical resistance through the interconnection between the associated circuit elements (e.g., pads); (3) sensitivity to dust, debris, and other environmental elements that could adversely affect a sound connection; and (4) limited density (e.g., due to physical limitations of particular connector designs).

When connecting the surfaces of two components, such as a ceramic material module and a glass-epoxy printed circuit board, a significant amount of compliance is required for the glass-epoxy bond. This compliance must be accommodated by the connector, which must overcome the flatness and irregularities inherent in the surfaces of the board and the module as well as their different thermal coefficients of expansion. The planarity and rigidity of the ceramic is relatively good. As pressure is applied to the edge of the ceramic component to connect a plurality of connectors, the glass-epoxy printed circuit board has a tendency to bow as the area array increases. Moreover, during use of the completed device, heating causes uneven expansion of the board and the module, thereby leading to further bowing. This bowing must be accommodated by the connector. It should be noted that, as the body size of the modules gets larger, mismatch due to differing coefficients of thermal expansion increases. For example, as the size increases to greater than about 32 mm (1.25 inches), the mismatch becomes great.

Area array packages or ball grid array (BGA) modules, including such modules as ceramic ball grid array (CBGA) modules and tape ball grid array (TBGA) modules, and land grid array (LGA) modules, typically have 90/10 weight percent lead/tin (Pb/Sn) solder balls on the underside of the package. These solder balls are connected to adhesion pads, typically copper (Cu) pads, residing on a printed circuit board (PCB) by reflowing 63/37 Pb/Sn eutectic solder paste. Interconnectors or interposers have been used between the solder balls and the adhesion pads to facilitate adhesion.

Currently, most of the solder ball connector (SBC) and solder column connector (SCC) interposers available in industry require mounting holes to be placed into the card or board. The mounting holes detract from wirability and increase the footprint of the card or board because the holes are defined as "keep out" zones for surface components.

An SBC or SCC interposer should be able to be used with a card or board designed for a surface-mounted module. This possibility gives the board designers the flexibility to design a board that can be used directly with surface-mounted modules or with interposer connectors. Presently available interposers that are dendrite plated (e.g., the Flexiposer™ interposer available from International Business Machines Corp. of Armonk, N.Y.) do not have adequate compliance to compensate for the forces that affect the Z-axis forces of a stacked connection between a module and a board or card.

A need exists, therefore, for an interposer having compliance and flexibility to be used in different packages depending on the application. Moreover, a need exists for a surface-mounted interposer that can be used with an existing card or board that was originally designed for direct solder of an SBC/SCC module. This type of connector, if compliant, would be a great advantage over current connectors.

Although the art of circuit module to supporting substrate connections is well developed, there remain some problems inherent in this technology. One particular problem is the bowing and formation of a crack in the Z-direction caused by compression forces and differing thermal coefficients of expansion. Therefore, a need exists for a structure that increases the reliability of the connection between a circuit module and a supporting board or card.

SUMMARY OF THE INVENTION

To meet these and other needs, and in view of its purposes, the present invention provides a structure and method for increasing the reliability of the connection between an area array package or other circuit module and a supporting substrate such as a board or a card. A typically dendrite-plated interposer or connector is placed between the module and the board or card.

In the present invention, a "Z" shaped interposer, typically coated with dendrites or having a raised bump, is mounted above the mounting pad on a board or card. The module having a ball or a pad is then mounted with compression to the surface of the interposer having the dendrites or raised bump. Because connection failures occur by forces propagating a crack in the Z-direction, the interposer spreads the forces throughout the structure of the interposer, thereby slowing the propagation of the crack and increasing the reliability of the interposer.

The present invention provides a "Z" shaped interposer for electrically interconnecting first and second electrical circuit members. The interposer comprises a substantially flat first conductive end portion having a free end and a connected end, a second conductive end portion having a free end and a connected end, and a conductive element connecting the connected end of the first conductive end portion to the connected end of the second conductive end portion. The first and second conductive end portions are adapted to engage the first and second electrical circuit members, respectively, when positioned substantially between the first and second electrical circuit members. The interposer has a center of gravity relative to the first conductive end portion such that the interposer may stand upright upon the first conductive end portion without external support. The interposer preferably comprises beryllium copper and has a nickel overplate. One of the conductive end portions of the interposer preferably has dendrites formed on it. The dendrites preferably comprise palladium.

According to one aspect of the present invention, the conductive end portions are of substantially similar width, thickness, or both. According to another aspect of the present invention, the conductive element and the first and second conductive end portions are formed from one continuous, unitary, integral member.

Additional embodiments within the scope of the present invention include the process of making the interposer by cutting and forming a length of metallic material into a Z-shape and the process of making the interposer by chemically etching a length of metallic material into a Z-shape. An additional embodiment within the scope of this invention includes the method of interconnecting first and second electrical circuit members with an interposer of this invention. The method comprises the steps of providing dendrites on a surface of at least one of the first and second conductive end portions of the interposer; aligning and contacting the first conductive end portion of the interposer with an electrical contact pad of the first electrical circuit member; aligning and contacting the second conductive end portion of the interposer with an electrical contact pad of the second electrical circuit member; and compressing the interposer and the first and second electrical circuit members.

The method may further comprise providing the interposer in a series of interposers removably attached to a carrier strip. In such case, the first conductive end portions of the series of interposers on the carrier strip is aligned with, contacted to, and attached to a corresponding series of electrical contact pads of the first electrical circuit member. The carrier strip is then removed from the series of interposers before aligning and contacting the second conductive end portions of the series of interposers with a series of electrical contact pads on the second electrical circuit member. An alignment block may further be provided, having an array of holes aligned with an array of contact pads on the first and second electrical circuit members. In such case, the method further comprises placing a plurality of carrier strips into the alignment block to form an array of interposers, the array of interposers being aligned and contacted with and then attached to the array of contact pads on the first electrical circuit member. The plurality of carrier strips are then removed from each series of interposers before aligning and contacting the array of interposers with the array of contact pads on the second electrical circuit member. The alignment block may then be removed or may remain after removing the array of interposers from their respective carrier strips.

Yet another embodiment within the scope of the present invention includes a system for interconnecting first and second electrical circuit members. The system comprises an interposer of the present invention; an alignment mechanism both for aligning the first conductive end portion of the interposer with an electrical contact pad of the first electrical circuit member and for aligning the second conductive end portion of the interposer with an electrical contact pad of the second electrical circuit member; and a compression mechanism operatively connected to one of the first and second electrical circuit members. The compression mechanism is adapted to exert a predetermined force against one of the first and second electrical circuit members to cause the first and second conductive end portions of the conductive element to engage the electrical contact pad of the first electrical circuit member and the electrical contact pad of the second electrical circuit member, respectively.

The foregoing and other aspects and embodiments of the present invention will become apparent from the following detailed description of the invention when considered in conjunction with the accompanying drawing.

DESCRIPTION OF EXEMPLARY EMBODIMENTS AND BEST MODE

The present invention is directed to spring connectors, or interposers, formed on a supporting substrate and to methods of fabricating such interposers. The present invention is used to join semiconductor chips and circuit modules, such as ball grid array (BGA) modules and flip chips, to a substrate, such as a printed circuit board, a microelectronic circuit card, or any organic or ceramic chip carrier or organic circuit board. An interposer, preferably coated with dendrites, is used as an interconnection to prevent or delay bowing and crack propagation in the Z-direction, thereby increasing reliability. The bowing or crack occurs during use of the combined components due to their different thermal coefficients of expansion. Because the crack propagates in the Z-direction, a structure that prevents or delays its growth in the Z-direction and induces the forces that form the crack to move away from the structure increases the fatigue life of the device.

Figure 1A:
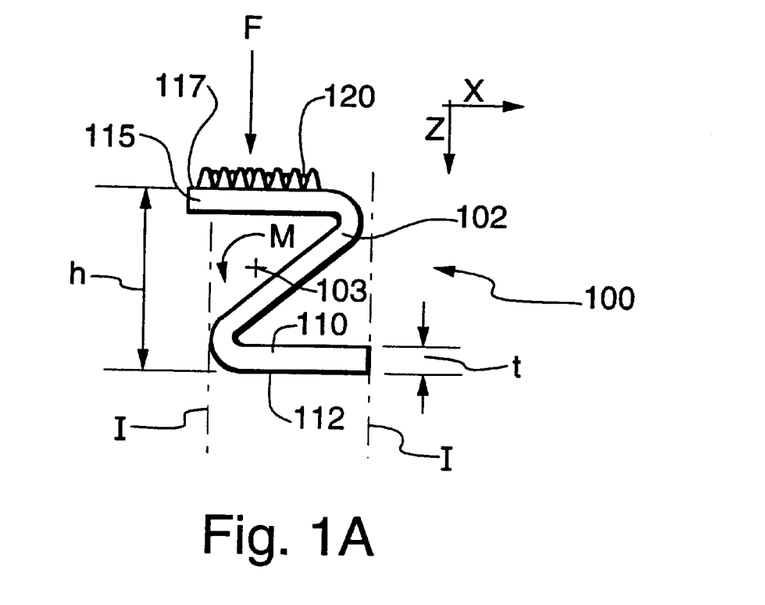
FIG. 1A is a side view of an exemplary interposer in accordance with the present invention.
Figure 1B:
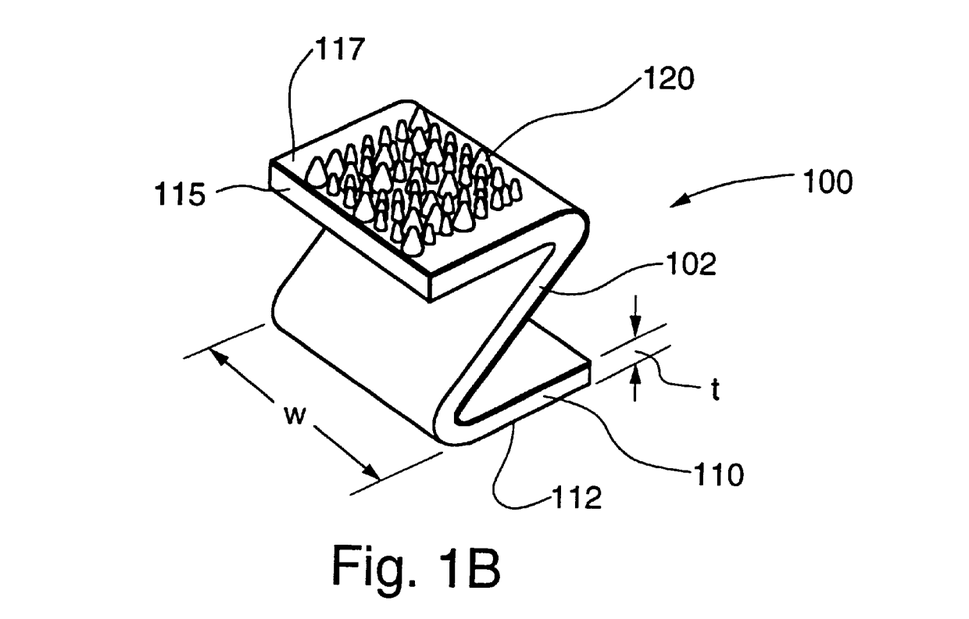
FIG. 1B is a perspective view of the exemplary interposer of FIG. 1A.

A side view and perspective view of an exemplary structure in accordance with the present invention are shown in FIGS. 1A and 1B, respectively. As is shown in FIGS. 1A and 1B, each interposer 100 includes a central portion 102 with first and second projecting end portions 110 and 115 extending from the central portion 102 to form a "Z" shape. Each opposing end portion 110 and 115 is designed for electrically contacting respective circuit elements located on the respective surfaces of circuit members to be connected. These circuit members are described in greater detail below. Each end portion 110 and 115 of interposer 100 preferably engages a circuit member on one side of the end portion 110, 115. The first end portion 110 engages a board or card along a side 112; the second end portion 115 engages a circuit module along a side 117.

Interposer 100 is used to interconnect elements and reduce or prevent bowing and cracking in the Z-direction. Interposer 100 permits Z-axis movement. The functionality of interposer 100 may be further enhanced by the inclusion of penetrating-type contact geometries such as dendritic elements 120 on side 117 of second end portion 115 of interposer 100. In other words, second end portion 115 of interposer 100 preferably comprises a plurality of dendrites for providing enhanced connections. By "dendrites" are meant essentially vertical members extending outwardly from a generally planar area of electrically conductive material. Significantly, these penetrating-type contact geometries such as dendritic elements 120 are included on side 117 of end portion 115 to enhance the reliability of the connections by offering contact redundancy, which in turn reduces contact resistance and (by increasing heat dissipation) the temperature in the contacts during operation. Furthermore, dendritic elements 120 can penetrate through dust, films, fibrous debris, surface oxides, and other contaminants that may be present on the conductive pads or balls such as those shown for the circuit members described below. Thus, dendrites are added to the contact mechanism to increase the reliability of the final connection by providing aggressive mechanical piercing of surface oxides and contaminates.

The Z-shaped configuration of interposer 100, in which at least end portion 110 is substantially flat and the center of gravity 103 of interposer 100 is positioned over flat end portion 110, enables interposer 100 to stand unsupported on end portion 110. That is, if one envisions vertical planes "I" running through each horizontal edge of end portion 110 as shown in FIGS. 1A and 1B, center of gravity 103 must be contained within those planes. End portion 110 is typically soldered or otherwise secured in place, however, as described below.

Z-shaped interposer 100 typically comprises a strip of conductive material, having a thickness "t" and a width "w," that is bent into the Z-shape. The conductive material generally has a thickness of 0.076–0.127 mm (0.003–0.005 inches), and a width of about 0.6 mm (0.024 inches) for a 40-pitch configuration to about 0.8 mm (0.032 inches) for a 50-pitch configuration. The thickness is dependent on the pitch and the load of the mating force under which the interposers are to be compressed—the higher the mating force or larger the pitch, the greater the thickness. "Pitch" is the on-center distance between interposers in an array or series of interposers. The number of the pitch refers to the on-center spacing of contacts in thousandths of an inch (i.e., a 40 pitch has contacts spaced 1 mm or 0.040 inches on center). The difference between the interposer width and the pitch provides a desirable amount of empty space between interposers. Thus, the ratio of width to thickness of a typical interposer according to the present invention is generally greater than 5:1, and typically in the range of about 5:1 to about 11:1. Because the width is much larger than the thickness, interposer 100 has better stability and greater capability of standing upright upon end portion 110 without external support than, for example, an S-shaped interposer made of bar stock in which the thickness and width are essentially in a 1:1 ratio.

When Z-shaped interposer 100 is compressed by a force "F," the motion of end portions 110 and 115 relative to one another is predictable—end portions 110 and 115 move toward one another along the Z-axis and slide parallel to one another along the X-axis. The "wiping" movement along the X-axis is desired for providing a reliable connection. An S-shaped interposer of bar stock, on the other hand, would tend to have unpredictable movement and would require external support to keep the interposer from rotating out of the desired position for the critical contact surfaces. As the "pitch" decreases, the amount of relative wiping motion designed into the interposer also typically decreases, and thus the addition of dendritic elements 120 or other contact elements help to provide the desired reliable connection.

By having center of gravity 103 centered or nearly centered over end portion 110, force F distributed over end portion 120 is also essentially centered over center of gravity 103. Therefore, the moment "M" about center of gravity 103 imparted by force F is zero or relatively small, depending on the vertical alignment of force F and center of gravity 103. The more center of gravity 103 is out of vertical alignment with force F, the greater the moment M, and the greater resultant opposition force required of the adhesive bond between contact side 112 of end portion 110 and the element (not shown) to which side 112 is typically soldered.

Interposer 100 is fabricated using methods such as punching or chemical etching, depending on the volume or customization desired. Punching includes the steps of cutting a predetermined length of a metallic material to form a conductive element or central portion 102 having a first and a second end, and forming the conductive element into a Z shape having a first and a second end portion 110 and 115 extending from the conductive element by bending the first and second ends of the conductive element at first and second angles, respectively. The conductive element is then plated, and dendritic elements 120 are formed on a surface (or side) of at least one of the first and second end portions 110 and 115. Chemical etching includes the steps of chemically etching a predetermined length of a metallic material to form a flat conductive sheet element, and forming the conductive sheet element into a Z shape having a first end portion 110 and a second end portion 115 extending from the conductive element, as described above with respect to punching. The end portions 110 and 115 can have substantially similar widths, thicknesses, or both.

Each interposer 100 preferably comprises beryllium copper (BeCu), but any similar metallic material (such as copper or phosphor bronze) may be used. Interposer 100 is preferably formed of one continuous, unitary, integral piece of the material. Preferably, a thin layer (e.g., 500 nm or 0.00002 inches to 760 nm or 0.00003 inches) of nickel is deposited as a corrosive barrier to enhance dendrite adhesion, before forming dendritic elements 120. Dendritic elements 120 (formed preferably of Dendriplatem™ material manufactured by International Business Machines Corp. of Armonk, N.Y.) are then added using a method such as electroplating. Preferred materials for the fabrication of dendritic elements 120 are metals or combinations, composites, or alloys of metals selected from the group consisting of palladium, nickel, gold, platinum, rhodium, ruthenium, iridium, and osmium.

Interposer 100 preferably provides a total of 0.5 mm (0.020 inches) deflection to be spread between the card and the module. Moreover, the shape of interposer 100 is such that it can travel in excess of 0.5 mm (0.020 inch) while preferably maintaining a minimum of 30 grams in normal force to ensure a reliable contact through the lifetime of the device. The height "h" of interposer 100 is preferably sufficient to accommodate the compliance of the system into which it is incorporated. Because interposer 100 is typically designed for use instead of a solder ball connection, the height, h, of interposer 100 is typically 0.76 to 0.89 mm (0.030 to 0.035 inches), similar to a standard solder ball. Because inductance is linearly proportional to height, keeping the interposer height the same as a standard solder ball matches the known performance level of the typical solder ball. Each interposer 100 may be contained in a housing (not shown), preferably plastic, for ease of handling and placement of interposer 100. The housing is not required for support of interposer 100, however, because interposer 100 is designed to stand upright without support.

Each interposer 100 may be incorporated in a series or array of interposers 100. The series or array of interposers 100 engages a series or array of individual, flat, conductive pads of a circuit module and a card or board. Interposer 100 is connected to the circuit members by attachment mechanisms such as soldering, welding, or a conductive adhesive. Thus, interposer 100 can be directly soldered to an existing card or board application and also can be used in a mechanical attachment of a module to a card.

Examples of suitable circuit members for being interconnected by interposer 100 include printed circuit boards, circuit modules, and the like. These circuit members may be printed circuit boards having flat conductive members (e.g., copper terminals) located on an outer surface of the boards. The term "printed circuit board" is meant to include a multi-layered circuit structure including one or more conductive (e.g., signal, power, or ground) layers. These circuit members may also comprise a circuit module including a substrate having a plurality of semiconductor elements and corresponding conductive elements located on a bottom, external surface. The term "circuit module" is meant to include a substrate or like member having various electrical components (e.g., semiconductor chips, conductive circuitry, conductive pins, and the like) which may form part of the substrate. The defined conductive pads are electrically coupled to corresponding circuitry that forms part of the respective electrical circuit members. These pads may provide signal, power, or ground connections, depending on the operational requirements of the respective circuit member. Such printed circuit boards, also known as printed wiring boards, and modules are well known in the art and further description is not believed necessary.

Figure 2A:
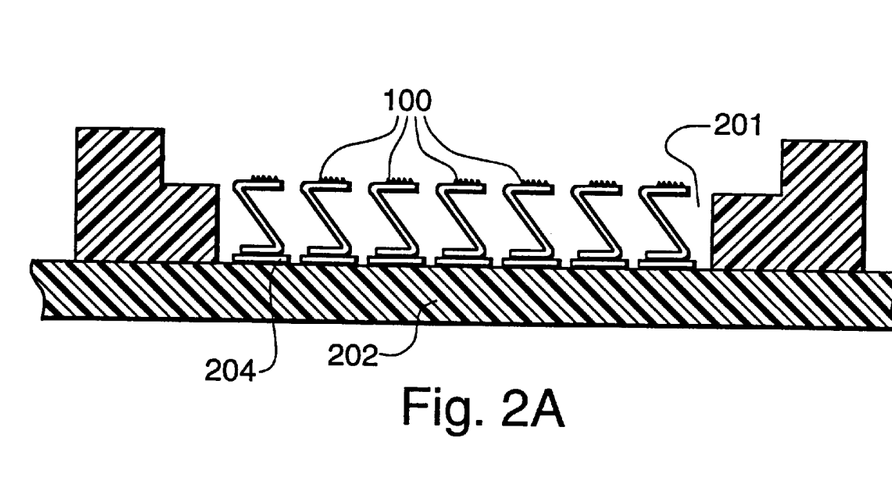
FIG. 2A shows a cross-section of an array of interposers in accordance with the present invention.
Figure 2B:
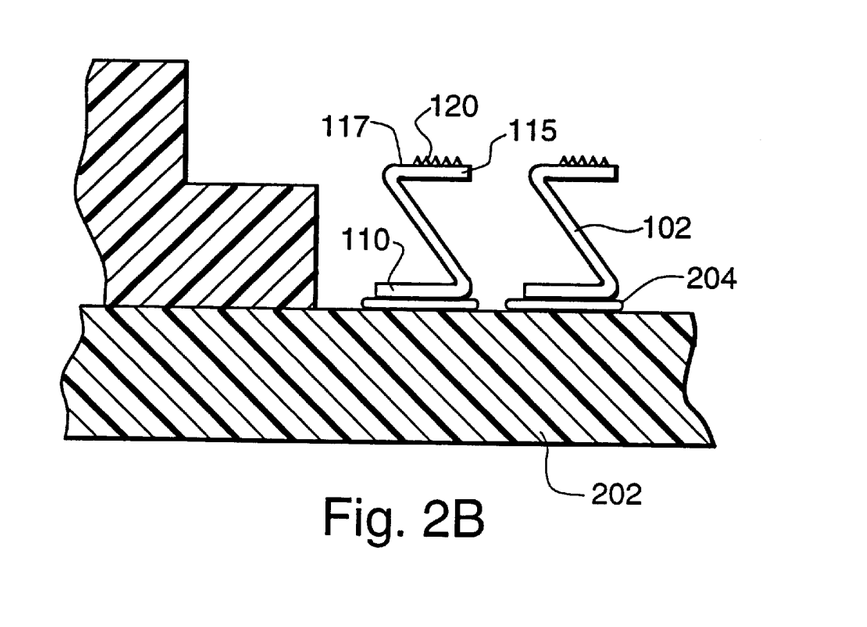
FIG. 2B shows an enlarged portion of the cross-section of FIG. 2A.

FIG. 2A shows a cross-section of an array of interposers 100 in accordance with the present invention. Multiple interposers 100, of the type described with respect to FIGS. 1A and 1B, are arranged in a spaced orientation within a central opening 201. Interposers 100 are mounted on a board or card 202 by solder 204. FIG. 2B shows an enlarged portion of the cross-section of FIG. 2A. Preferably, the distance (center to center) between neighboring interposers 100 is 1 mm (0.040 inch). Interposers 100 are mounted on board or card 202 before connection with a circuit module, as described below with respect to FIG. 3A. Interposer 100 of the present invention does not require extra mounting holes in card or board 202 for attaching interposer 100.

Figures 8A, 8B:
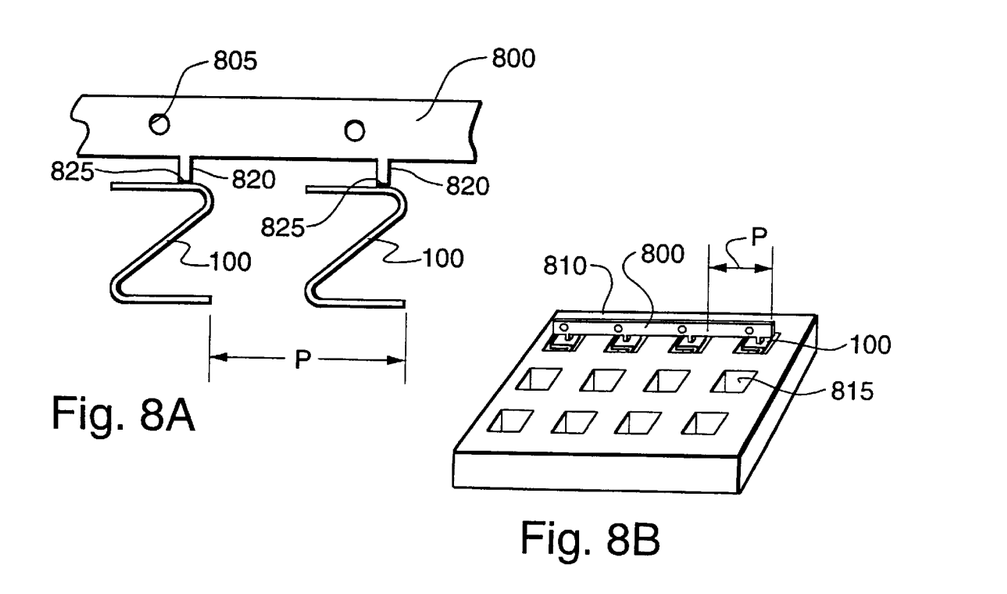
FIG. 8A is a side view of an exemplary carrier strip containing an array of interposers.
FIG. 8B is a perspective view of an exemplary assembly block adapted for positioning a set of carrier strips.

A preferred method of placing interposers 100 in a series or array is to form the series of interposers 100 into a carrier strip 800, as shown in FIG. 8A. Carrier strip 800 performs two functions. The first function is to provide a method of holding the contacts in a relative pitch "P," such as 1.25 or 1 mm (0.050 or 0.040 inches) depending on the application. The second function is to provide a mechanism to increment the material through the manufacturing process in a progressive fashion. For example, interposers 100 may be held on carrier strip 800 during formation, during plating, and during final assembly of interposers 100 onto a circuit board such as board 202 shown in FIG. 2A. Indexing hole 805 may, for example, interface with pins of a handling device that indexes carrier strip 800 through the various operations.

The assembly of interposers 100 onto circuit board 202 may be performed using an assembly aid, such as assembly block 810 shown in FIG. 8B, that is typically the same size as a desired array of contact positions on circuit board 202. Assembly block 810 has an array of holes 815 into which interposers 100 may be inserted. Assembly block 810 retains carrier strip 800 on its top, preventing interposers 100 from falling through holes 815. Assembly block 810 may then be picked up and positioned over the circuit board array.

The circuit board array typically has a predetermined volume of solder 204 applied over each array pad (not shown). The solder in paste form is then reflowed, typically using an infrared reflow oven, and thereby end portions 110 are physically connected to circuit board 202. Once the reflow step is completed, carrier strips 800 can then be removed from interposers 100 by a back and forth bending of the strips from the contacts. As shown in FIG. 8A, tab 820 may have a score 825 or perforations to facilitate removal of interposer 100 from contact strip 800. Once contact strips 800 have been removed, assembly block 810 can then be lifted off circuit board 202, leaving interposers 100 soldered in place.

In an alternate embodiment, assembly block 810 could be left in place as additional support to the contacts or to provide a location mechanism for the adjoining member to circuit board 202. Thus, assembly block 810 may have molded pins or walls (not shown) into which the adjoining member can be set. In such an embodiment, assembly block 810 may comprise a high-temperature-rated material, such as Ryton®, a thermoplastic, thermosetting resin manufactured by Phillips Petroleum Company of Bartlesville, Okla.

Figure 3A:
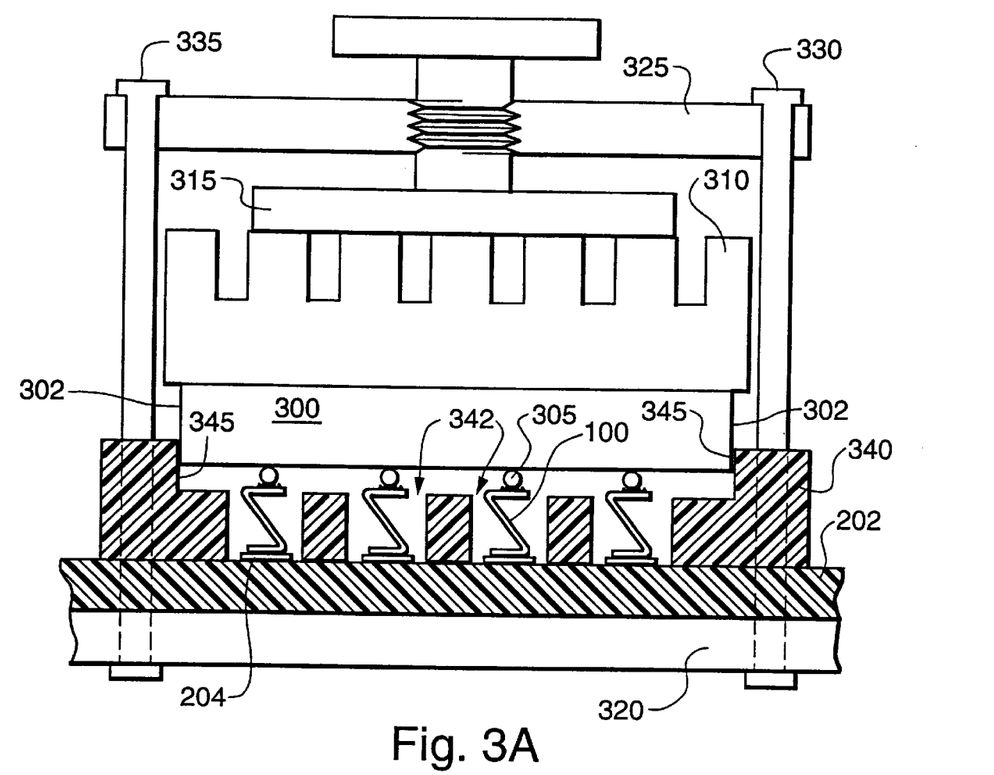
FIG. 3A shows a cross-section of an array of exemplary interposers incorporated into a ball grid array structure.
Figure 3B:
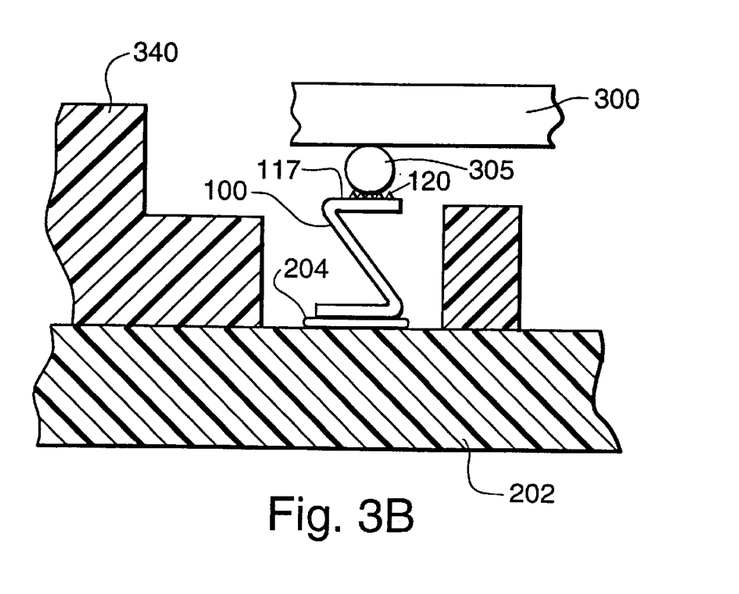
FIG. 3B shows an enlarged portion of the cross-section of FIG. 3A.

FIG. 3A shows a cross-section of an array of exemplary interposers 100 incorporated into a ball grid array structure. FIG. 3B shows an enlarged portion of the cross-section of FIG. 3A. In FIG. 3A, the opposing circuit members, e.g., circuit module 300 having solder balls 305 and board or card 202, are moved relative to each other by an external clamping means, e.g., a spring plate or push plate 315 (shown attached to a heat sink 310), so as to compress interposers 100. Each of the circuit members (module 300 and board or card 202) engages an end of interposer 100 to provide interconnection between the circuit members in the desired manner. Conventional stiffeners 320 and 325 and pins 330 and 335 are used for alignment. Housing 340, having a plurality of channels 342 into which interposers 100 are placed, also provides alignment of module 300 by aligning edges 302 of module 300 with vertical alignment edges 345 of housing 340.

FIGS. 3A and 3B show the embodiment in its unactuated state, before compression. Interposer 100 occupies a first, pre-stressed position before engagement and is adapted for moving to a second, compressed position during the engagement. Interposer 100 is engaged when the two circuit members 202 and 300 are aligned and moved toward each other (e.g., compressed) using plate 315. The mechanical connection of the circuit member to interposer 100 is made by the aligned compression of interposers 100 against the circuit member top and the interposer contacts below. This connection can also be done using a fixed displacement system and pressing interposers 100 down to a known displacement.

The end portions 110, 115 of interposer 100 are at maximum force almost immediately after initially contacting the conductive pads (solder 204 and solder balls 305), and substantially maintain that same force during the remainder of actuation. Contact members of this embodiment can occupy a first, pre-stressed condition before engagement with circuit members 202 and 300 and thereafter move to a second position in which these members are in a compressed state. Such compression occurs after the end portions 110, 115 of the contact have engaged respective pads 204 and 305. The contact members are thus in a pre-stressed condition before such engagement. In addition, interposer 100 does not have to be overdriven to achieve a minimum force per contact, thus rendering the invention capable of minimizing unnecessary clamping forces on circuit members 202 and 305.

As described above with respect to FIGS. 1A and 1B, interposer 100 has side 117 coated with dendritic elements 120. Side 117 corresponds to the contact on the semiconductor chip. The chip contact can be any known type including metal ball, bumps, or tabs or may be provided with dendritic surfaces. The chip contact is aligned with and brought into relatively loose contact with the contact on interposer 100 and then a compressive force of about 30 grams per chip is applied to the chip to force the chip contact into good electrical contact with the interposer contact. In other words, a preferred force of, for example, 30 grams per contact with a pre-defined Z-deflection is applied to interposer 100 to connect the circuit member and the carrier. The circuit member is pressed onto the interposer contacts until the circuit member is bottomed onto a feature on the base carrier. Thus, because of the described configuration, interposer 100 reduces the bending stresses in each circuit member and reduces the combined stiffness.

By applying conventional principles of surface mounting, such as controlling the amount of solder paste and the surface geometry of the contacts, the surface tension of the solder during reflow self-centers interposer 100 to the card pads to ensure proper connection to the card. This arrangement reduces the need for an additional alignment mechanism. In some cases, in which the circuit members require a large heat sink, mounting holes are preferably placed onto the card. These holes are used to anchor the support mechanisms required for the heat sink, not for interposer 100.

Figure 4A:
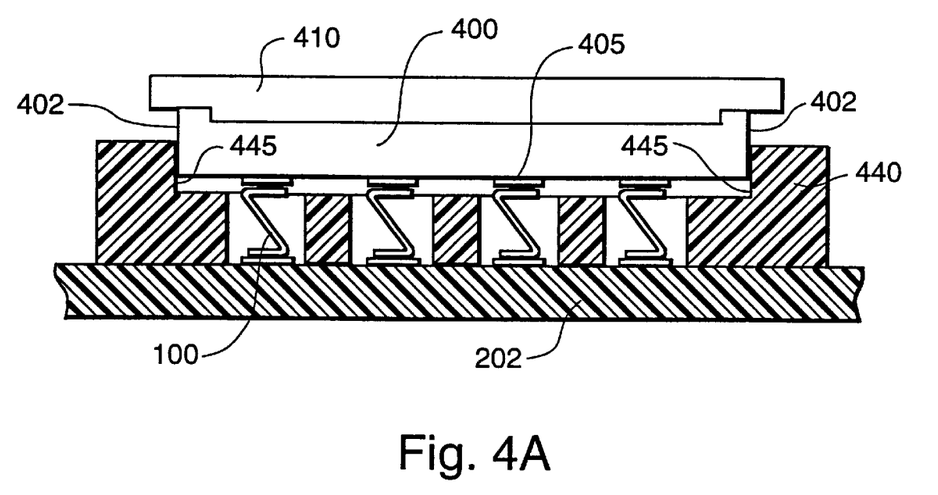
FIG. 4A shows a cross-section of an array of exemplary interposers incorporated into a land grid array structure.
Figure 4B:
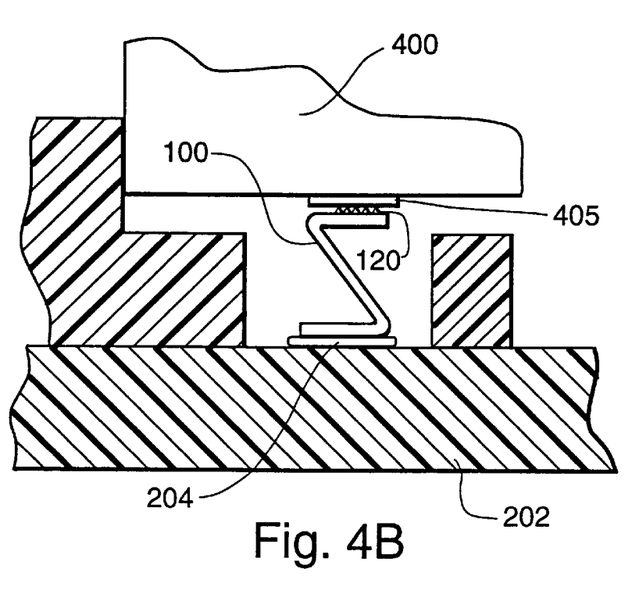
FIG. 4B shows an enlarged portion of the cross-section of FIG. 4A.

FIG. 4A shows a cross-section of an array of exemplary interposers 100 incorporated into a land grid array (LGA) structure. FIG. 4B shows an enlarged portion of the cross-section of FIG. 4A. FIGS. 4A and 4B show the embodiment in its unactuated state, before compression. FIG. 4A is similar to FIG. 3A except that contact pad 405 replaces solder ball 305. Contact pad 405 is attached to a module 400. Module 400 is pressed onto the interposers 100 for compression by a plate 410. Thus, interposer 100 of the present invention can be used in an LGA application in which there are no solder balls or columns. Stiffeners and pins are similar to those in FIG. 3A and thus are not shown or described with respect to FIG. 4A for brevity. Housing 440 has alignment edges 445 that align with edges 402 of module 400.

In this application, interposers 100 may be placed using carrier strips 800 as shown in FIG. 8A, or may be placed individually using housing 440 for alignment. When interposers 100 are placed with carrier strips 800, housing 440 may serve as an alignment block (such as assembly block 810 as shown in FIG. 8B and described with reference to that figure) with the alignment block (housing 440) remaining as part of the completed assembly. If interposers 100 are placed without carrier strips 800, the Z-shaped configuration of interposers 100, having flat end portion 110 and center of gravity 103 positioned over end portion 110 as shown in FIG. 1A, enables interposers 100 to remain upright supported only by end portion 110 until solder 204 is reflowed as shown in FIG. 4B. Even if interposers 100 are placed with carrier strips 800, housing 440 does not provide lateral support of interposers 800, and the upright stability of individual interposers 800 also allows the strip of interposers 100 to stand upright until the reflow step is completed.

Figure 5A:
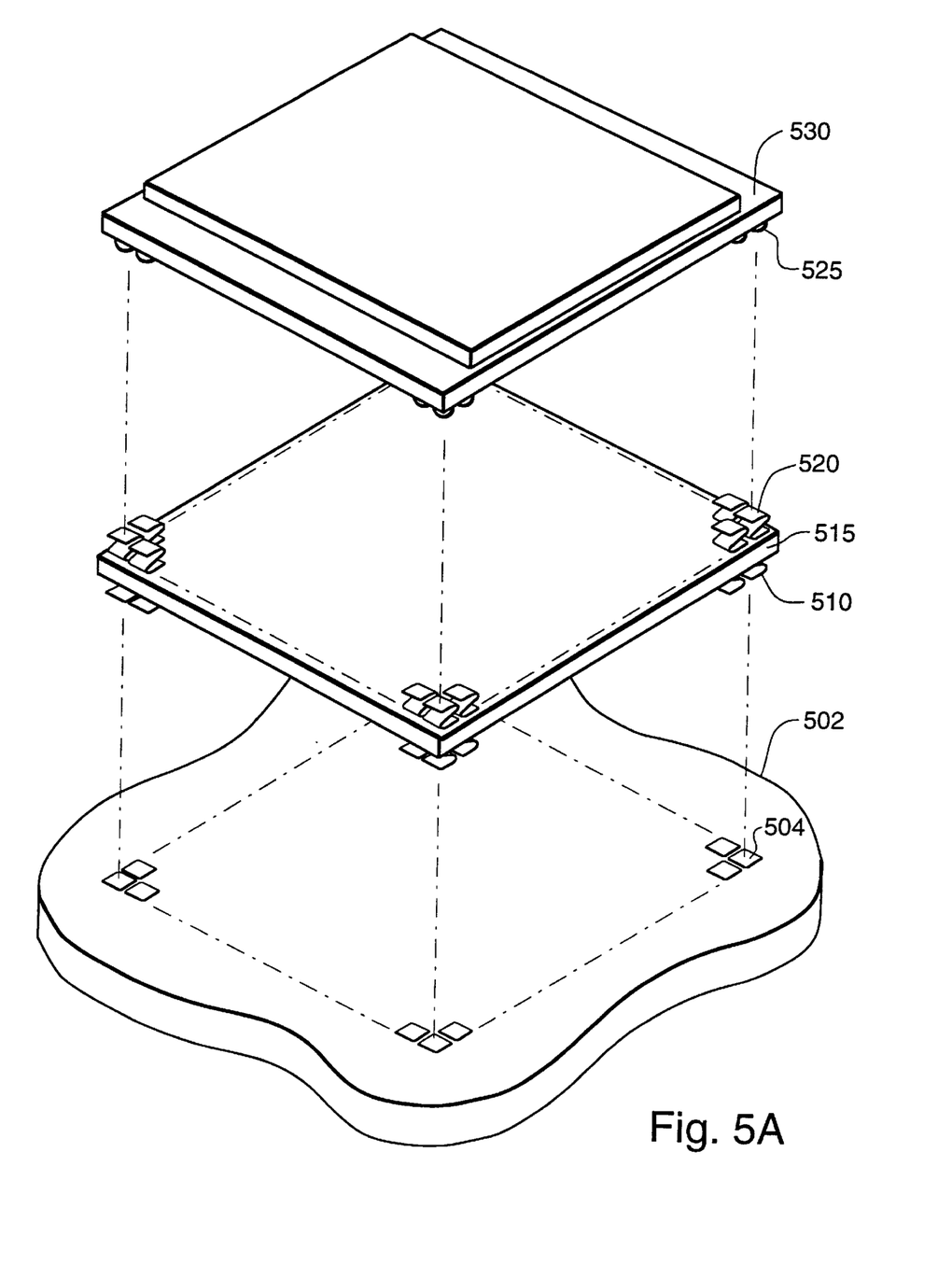
FIG. 5A shows an exploded perspective view of an exemplary stacked structure including interposers in accordance with the present invention.
Figure 5B:
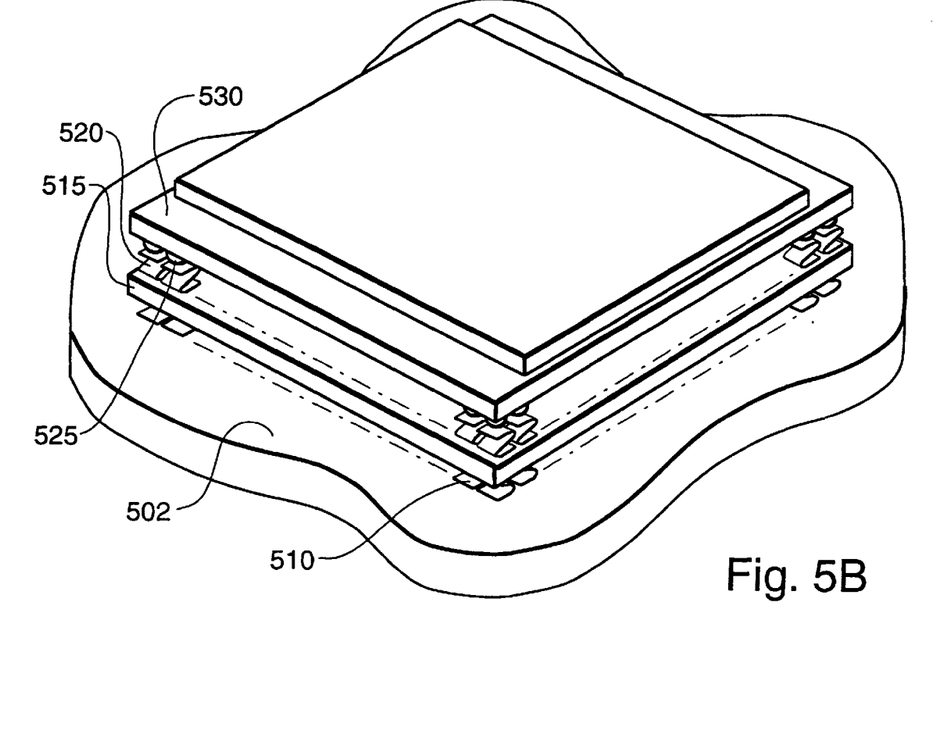
FIG. 5B shows a perspective view of the structure of FIG. 5A.
Figure 5C:
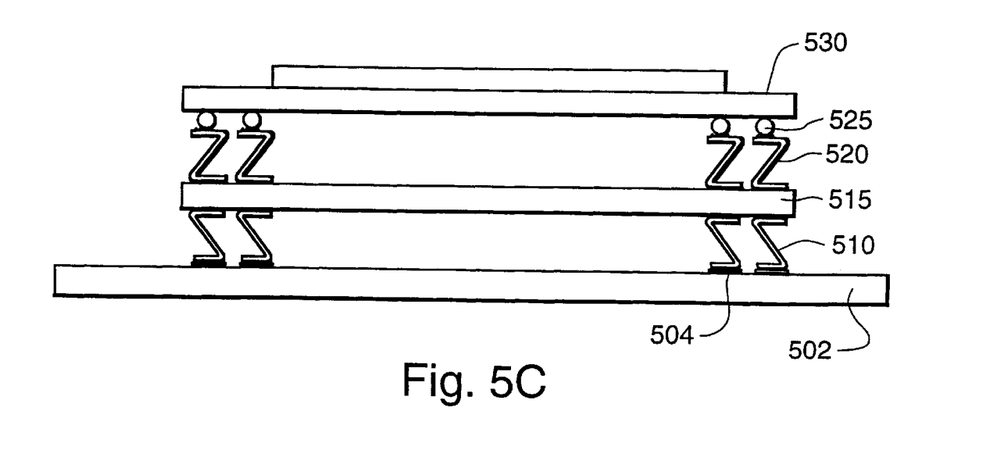
FIG. 5C shows a side view of the structure of FIG. 5B.

FIG. 5A shows an exploded perspective view of an exemplary stacked structure of multiple levels of circuit members and includes interposers 510 and 520 in accordance with the present invention. This structure is used for a removable connection during testing and prototyping to keep the card in its natural state. A supporting substrate 502 has contact pads 504. A circuit module 515 having interposers 510 underneath is aligned for mounting on the contact pads 504. Circuit module 515 also has interposers 520 mounted on its top surface. A circuit element, such as a BGA structure 530 having solder balls 525 as contacts, is ultimately stacked on interposers 520 to complete the stackable structure as shown in FIGS. 5B and 5C. The stacked structure is formed under compression similar to that described above with respect to FIGS. 3A and 3B.

Figure 6:
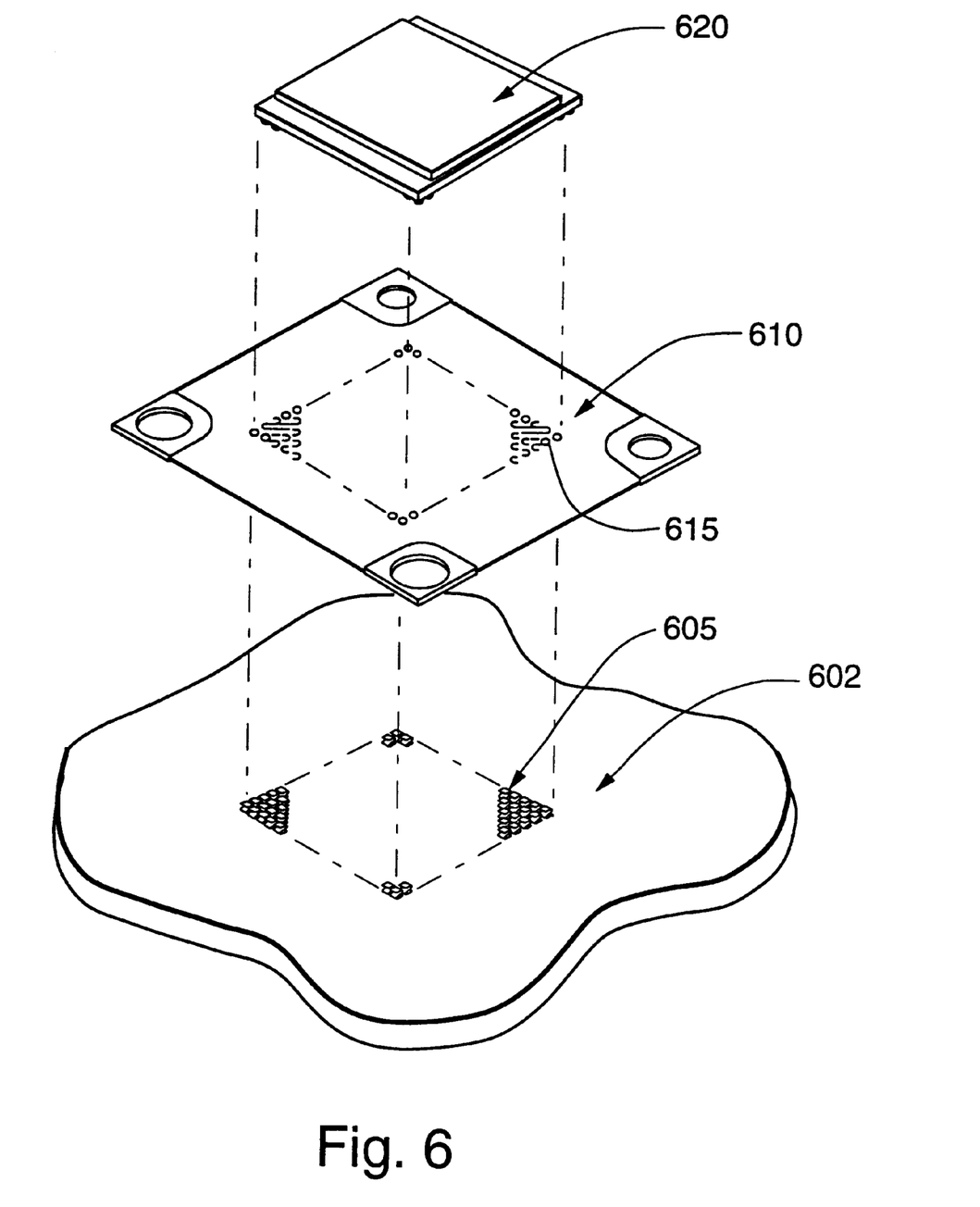
FIG. 6 shows an exploded perspective view of a further exemplary stacked structure including interposers in accordance with the present invention.

FIG. 6 shows an exploded perspective view of a further exemplary stacked structure including interposers in accordance with the present invention. In the structure of FIG. 6, a card or board 602 has an array of interposers 605 mounted on the top surface. A circuit board, such as a flex board 610, is stacked (mounted) on the interposers 605. Interposers 605 do not have dendrites. On top of flex board 610 is an array of contacts 615, preferably having dendrites. A circuit module, such as a BGA module 620, is aligned with the contacts 615 to complete the stacked structure.

Thus, a solder ball connector (SBC) and a solder column connector (SCC) interposer is provided that can be soldered onto a card or board that has been designed for a soldered module. The interposer of the present invention can be used on an existing card or board designed for SBC or SCC without making any changes to existing solder masks, pad sizes, or pad definitions. The interposer has compliance that can accommodate tolerances of the card, the interposer, and the modules. The present invention provides high compliance for solder ball or other contact co-planarity as well as for card or board co-planarity. No additional features on the card or modules are required for the interposer to function. The interposer of the present invention compensates for the Z-tolerances of the solder balls, other contacts, or the card or board to which it is mounted. The interposer works with all Joint Electron Device Engineering Council (JEDEC) compliant modules regardless of the manufacturer of the module. Moreover, the interposer may be SBC and SCC surface mountable, if desired.

Figure 7A:
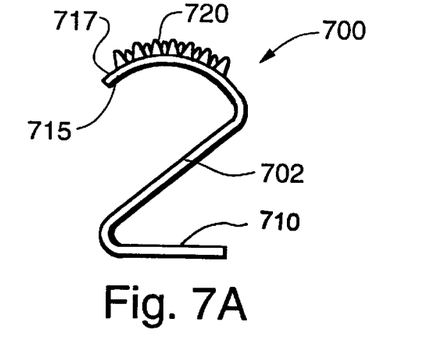
FIG. 7A is a side view of a further exemplary interposer in accordance with the present invention.
Figure 7B:
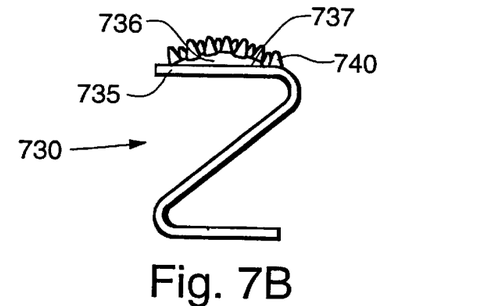
FIG. 7B is a side view of a further exemplary interposer in accordance with the present invention.

Side views of additional exemplary structures in accordance with the present invention are shown in FIGS. 7A and 7B. As shown in FIG. 7A, the interposer 700 has a projecting end portion 715 extending from the central portion 702. End portion 715 is curved and has dendrites 720 formed on contact side 717. The 2-shaped structure of FIG. 7A provides a rolling action so that, as end portion 715 is compressed, contact side 717 rolls to give multiple contact points with the structure that is compressing interposer 700.

As shown in FIG. 7B, the interposer 730 has a projecting end portion 735. End portion 735 has a bump 736 protruding on the contact side 737. A dome structure is punched in the structure to form bump 736. Bump 736 provides rolling in multiple directions when interposer 730 is compressed. Dendrites 740 are formed on contact side 737, including that portion of side 737 formed over bump 736. Bump 736 has a height in the range between about 1.9 mm (0.075 inch) and about 3.8 mm (0.15 inch).

Figure 7C:
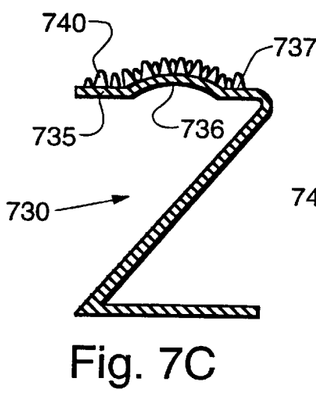
FIG. 7C is a cross-section of the exemplary interposer of FIG. 7B.
Figure 7D:
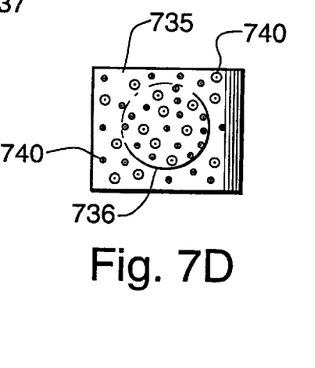
FIG. 7D is a top view of the exemplary interposer of FIG. 7B.

The structure in FIG. 7C is a cross-section of FIG. 7B showing that bump 736 is hollow. FIG. 7D shows a top view of the exemplary structure of FIG. 7B. Bump 736 is raised in the center of end portion 735 of the exemplary structure. The entire surface is covered with dendrites (not shown). Although bump 736 as shown is substantially circular and substantially centered on the pad, it is within the scope of the present invention that bump 736 can take other shapes and can be placed elsewhere on the surface of end portion 735. Similarly, although shown together with dendrites 740 in FIGS. 7A–C, it is within the scope of the present invention for end portion 735 to comprise bump 736 without dendrites.

Figure 7E:
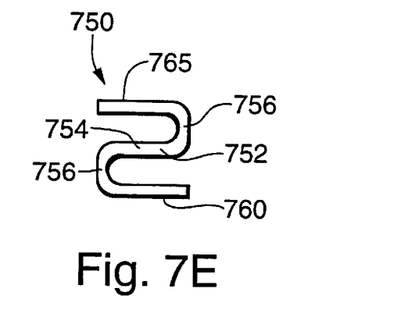
FIG. 7E is a side view of a further exemplary interposer in accordance with the present invention.

Although illustrated generally throughout as having a Z-shape or a 2-shape, such as for example in FIGS. 1A or 7A, respectively, where central portion 102 (or 702) is essentially a diagonal element between end portions 110 (or 710) and 115 (or 715), an interposer 750 comprising a 2-shaped structure having a connecting element 752 between end portions 760 and 765 is also contemplated. Connecting element 752 has a midsection 754 that is parallel to end portions 760 and 765. On either side of midsection 754 are curved connecting sections 756 that are perpendicular to end portions 760 and 765. Whereas the diagonal configuration of interposer 100 as shown in FIGS. 1A and 1B provides for translation along the x-axis during compression in the z-direction, the parallel midsection 754 of connecting element 752 provides relatively little if any x-axis movement. Similarly, the interposer of the present invention may comprise a connecting element between the ends that has a midsection angled to a degree somewhere between diagonal and horizontal (parallel to one or both end portions), tailored to provide a desired amount of x-axis translation. It should be noted that the term "2-shape" as used herein corresponds to the configurations shown in both FIG. 7A and FIG. 7E. The 2-shape of FIG. 7E, having a substantially flat end portion 760, when viewed from the opposite side than the side shown in FIG. 7E, could be said to have an S-shape. It should be noted, however, that the term "2-shaped" is intentionally used herein instead of the term "S-shape," to distinguish the applicants' invention from a configuration having a curved bottom end portion. An interposer having such a curved bottom end portion would be unable to stand without support, due to the curvature of the end portion.

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed:

1. An interposer for electrically interconnecting first and second electrical circuit members, said interposer comprising:

a substantially flat first conductive end portion having a free end and a connected end;

a second conductive end portion having a free end and a connected end;

a conductive element connecting said connected end of said first conductive end portion to said connected end of said second conductive end portion, said conductive element and said first and second conductive end portions forming a Z-shape or a 2-shape, said first and second conductive end portions adapted for engaging said first and second electrical circuit members, respectively, when positioned substantially between said first and second electrical circuit members, said second conductive end portion comprising one of a raised bump that is convex in the direction of said second electrical circuit member, a plurality of dendrites, or a combination thereof; and a center of gravity positioned relative to said first conductive end portion such that said interposer stands upright upon said first conductive end portion without external support.

2. The interposer according to claim 1, wherein said conductive element and said first and second conductive end portions form a Z shape.

3. The interposer according to claim 1, wherein said conductive element and said first and second conductive end portions are a unitary member.

4. The interposer according to claim 1, wherein said conductive element and said first and second conductive end portions comprise beryllium copper.

5. The connector according to claim 4, wherein said conductive element and said first and second conductive end portions are plated with a layer of nickel.

6. The interposer according to claim 1, wherein said conductive end portions are of substantially similar width.

7. The interposer according to claim 1, wherein said conductive end portions are of substantially similar thickness.

8. An interposer for electrically interconnecting first and second electrical circuit members, said interposer comprising:

a substantially flat first conductive end portion having a free end and a connected end;

a second conductive end portion having a free end and a connected end;

a conductive element connecting said connected end of said first conductive end portion to said connected end of said second conductive end portion, said conductive element and said first and second conductive end portions forming a Z-shape or a 2-shape, said first and second conductive end portions adapted for engaging said first and second electrical circuit members, respectively, when positioned substantially between said first and second electrical circuit members, at least one of said conductive end portions having a plurality of dendrites; and a center of gravity positioned relative to said first conductive end portion such that said interposer stands upright upon said first conductive end portion without external support.

9. The connector according to claim 8, wherein said dendrites comprise palladium.

10. The interposer according to claim 1, wherein said interposer has a height sufficient to be compliant with said first and second electrical circuit members.

11. The interposer according to claim 1, wherein said second conductive end portion is substantially flat except for said dendrites, said raised bump, or both.

12. The interposer according to claim 1 wherein the interposer has a thickness, a width, and a ratio of width to thickness in the range of about 5:1 to about 11:1.

13. A process of making an interposer comprising the steps of:

cutting a predetermined length of a metallic material to form a conductive element having a first and a second end; and forming said conductive element into a Z-shape or a 2-shape having a substantially flat first end portion and a second end portion extending from said conductive element by bending said conductive element into said Z-shape or said 2-shape, said interposer having a center of gravity positioned relative to said first end portion such that said interposer stands upright upon said first end portion without external support;

plating said conductive element; and forming a plurality of dendrites on a surface of at least one of said first and second end portions.

14. The process according to claim 13, wherein said metallic material is beryllium copper.

15. The process according to claim 13 where said conductive element is plated with nickel and said dendrites comprise palladium.

16. An interposer formed by the process of claim 13.

17. A process of making an interposer comprising the steps of:

chemically etching a predetermined length of a metallic material to form a conductive element;

forming said conductive element into a Z-shape or a 2-shape having a substantially flat first end portion and a second end portion extending from said conductive element, said conductive element having a center of gravity positioned relative to said first end portion such that said interposer stands upright upon said first end portion without external support;

plating said conductive element; and forming a plurality of dendrites on a surface of at least one of said first and second end portions.

18. An interposer formed by the process of claim 17.

19. A method of interconnecting first and second electrical circuit members with an interposer comprising a substantially flat first conductive end portion having a free end and a connected end; a second conductive end portion having a free end and a connected end; a conductive element connecting said connected end of said first conductive end portion to said connected end of said second conductive end portion, said conductive element and said first and second conductive end portions forming a Z-shape or a 2-shape, said first and second conductive end portions adapted for engaging said first and second electrical circuit members, respectively, when positioned substantially between said first and second electrical circuit members; and a center of gravity positioned relative to said first conductive end portion such that said interposer stands upright upon said first conductive end portion without external support; said method comprising:

providing a plurality of dendrites on a surface of at least one of said first and second conductive end portions of said interposer;

aligning and contacting said first conductive end portion of said interposer with an electrical contact element of said first electrical circuit member;

aligning and contacting said second conductive end portion of said interposer with an electrical contact element of said second electrical circuit member; and compressing said interposer and said first and second electrical circuit members.

20. The method of claim 19 further comprising:

providing said interposer in a series of interposers removably attached to a carrier strip;

aligning and contacting the first conductive end portions of said series of interposers on said carrier strip with a corresponding series of electrical contact elements of said first electrical circuit member;

attaching said first conductive end portions to said electrical contact elements of the first electrical circuit member; and removing said carrier strip from said series of interposers before aligning and contacting said second conductive end portions of said series of interposers with a series of electrical contact elements on said second electrical circuit member.

21. The method of claim 20 further comprising:

providing an alignment block having an array of holes aligned with an array of contact elements on said first and second electrical circuit members; and placing a plurality of carrier strips into said alignment block to form an array of interposers;

aligning and contacting said array of interposers with said array of contact elements on the first electrical circuit member;

attaching said array of interposers to said array of contact elements on the first electrical circuit member;

aligning and contacting said array of interposers with said array of contact elements on the second electrical circuit member; and removing each of said plurality of carrier strips from the respective series of interposers attached to the carrier strip.

22. The method of claim 21 further comprising removing said alignment block after removing the plurality of carrier strips.

23. The method of claim 21 further comprising leaving said alignment block in place after removing said plurality of carrier strips.

24. A system for interconnecting first and second electrical circuit members, each having an electrical contact element, the system comprising:
   an interposer having:
      a substantially flat first conductive end portion having a free end and a connected end,
      a second conductive end portion having a free end and a connected end,
      a conductive element connecting said connected end of said first conductive end portion to said connected end of said second conductive end portion, said conductive element and said first and second conductive end portions forming a Z-shape or a 2-shape, said first and second conductive end portions adapted for engaging said first and second electrical circuit members, respectively, when positioned substantially between said first and second electrical circuit members, said second conductive end portion having one of a raised bump that is convex in the direction of said second electrical circuit member, a plurality of dendrites, or a combination thereof, and
      a center of gravity positioned relative to said first end portion such that said interposer stands upright upon said first conductive end portion without external support;
   alignment means for aligning said first conductive end portion of said interposer with said electrical contact element of said first electrical circuit member and for aligning said second conductive end portion of said interposer with said electrical contact element of said second electrical circuit member; and
   compression means operatively connected to one of said first and second electrical circuit members for exerting a predetermined force against said one of said first and second electrical circuit members to cause said first and second conductive end portions of said conductive element to engage said electrical contact element of said first electrical circuit member and said electrical contact element of said second electrical circuit member, respectively.

25. The system of claim 24 wherein said alignment means comprises at least one stiffener and at least one pin and the compression means comprises one of a push plate and a spring plate.

26. The system of claim 25 wherein said alignment means further comprises a housing mounted between said first and second electrical circuit members, said housing having an alignment edge to which an edge of said second electrical circuit member aligns.

27. The interposer according to claim 1, wherein said second conductive end portion is adapted to receive a compressive force transmitted from said second circuit member, said compressive force substantially centered over the interposer center of gravity to minimize or eliminate any moment exerted upon the interposer by the compressive force.

28. The interposer according to claim 1, wherein the interposer has a width, a height, and a ratio of width to height in a range of about 0.7 to about 1.1.

29. A method of interconnecting first and second electrical circuit members with the interposer of claim 1, said method comprising:
   providing a quantity of solder in a predetermined location on a pad of the first electrical circuit member, the solder having a surface tension;
   placing the interposer on the solder;
   reflowing the solder such that the surface tension of the solder centers the interposer in the predetermined location on the pad.

* * * * *